United States Patent [19]

Schilling

[11] Patent Number: 5,216,577

[45] Date of Patent: Jun. 1, 1993

[54] STABLE THERMAL ENCLOSURE FOR OUTDOOR ELECTRONICS

[75] Inventor: Robert J. Schilling, Fairport, N.Y.

[73] Assignee: Comtronics Enclosures Corporation, Fairport, N.Y.

[21] Appl. No.: 782,397

[22] Filed: Oct. 25, 1991

[51] Int. Cl.⁵ .............................................. H05K 7/20
[52] U.S. Cl. ................................. 361/380; 165/45; 165/912; 174/15.1; 174/38; 361/379
[58] Field of Search ...................... 174/15.1, 16.1, 37, 174/38; 165/45, 912, 104.33; 200/289; 361/331, 333, 334, 356, 357, 360, 380, 379, 382, 383–386, 388, 389, 428

[56] References Cited

U.S. PATENT DOCUMENTS

| | | |
|---|---|---|
| 873,166 | 12/1907 | Nichols . |
| 3,319,202 | 5/1967 | Lockie . |
| 3,420,943 | 1/1969 | Short . |
| 3,443,157 | 5/1969 | Uptegraff, Jr. . |
| 3,452,813 | 7/1969 | Watkins et al. . |
| 3,652,779 | 3/1972 | Grinols . |
| 4,129,743 | 12/1978 | Lohsl . |
| 4,564,061 | 1/1986 | Rauth ................... 165/104.33 |
| 4,674,561 | 6/1987 | Kelley ...................... 165/45 |
| 4,742,864 | 5/1988 | Duell ........................ 165/1 |
| 4,921,039 | 5/1990 | Ghiraldi .................... 165/32 |
| 4,921,043 | 5/1990 | Ghiraldi .................... 165/32 |
| 4,936,110 | 6/1990 | Kuckens .................... 165/45 |

FOREIGN PATENT DOCUMENTS

| | | | |
|---|---|---|---|
| 46870 | 4/1980 | Japan ....................... 165/912 |
| 492126 | 9/1938 | United Kingdom .......... 165/45 |
| 8002736 | 12/1980 | World Int. Prop. O. ........ 165/45 |

Primary Examiner—Gerald P. Tolin
Attorney, Agent, or Firm—Cumpston & Shaw

[57] ABSTRACT

An enclosure for our door electronics having an underground ground sleeve for providing a heat exchanger between the surrounding ground and a first fluid circuit. The enclosure also includes an ambient single pass fluid circuit. The geothermal fluid circuit is substantially closed such that approximately 20% or less of the volume in the closed circuit is exchanged during circulation.

10 Claims, 5 Drawing Sheets

STABLE THERMAL ENCLOSURE FOR OUTDOOR ELECTRONICS

The present invention relates to enclosures for electronic components and more particularly, to an outdoor enclosure for providing a stable thermal environment for the electronic components by circulating a thermal energy carrying fluid between an underground heat exchanger and the electronics.

BACKGROUND OF THE INVENTION

U.S. Pat. No. 3,319,202 to Lockie discloses a cooling system for partially buried transformers. The system includes baffles intermediate of the transformer and the transformer enclosure. The baffles form two concentric air spaces between the transformer and the enclosure such that the baffles substantially retain radiant energy within the air space between the baffles and the transformer. Ambient air is drawn into the apparatus between the barrier and the enclosure wall and subsequently passes between the baffle and the transformer to exit the housing.

U.S. Pat. No. 3,420,943 to Short disclosed a ventilator for underground electronic equipment. Short employs a tortuous air intake for directing ventilating air downward in the underground chamber such that the air subsequently rises past the transformer and exits through an above ground stack.

U.S. Pat. No. 3,443,157 to Uptegraff, Jr. discloses an electrical transformer disposed underground for direct dissipation. The transformer unit includes an elongated heat conductive tank in a sealed chamber in which the electronic components are housed.

U.S. Pat. No. 3,452,813 to Watkins et al. discloses an electric cable installation wherein ambient air is drawn into the installation and directed across a heat exchanger wherein the heated air is then expelled from the chamber.

Many devices of the prior art, either draw ambient air into an above ground or underground housing. The air is drawn over the electronics and discharged to the atmosphere. Although the use of ambient air provides a limitless supply of fluid for cooling the system, introduction of ambient creates substantial problems.

Ambient air usually includes a moisture or water content. Under certain conditions, the moisture may condense out of the ambient air onto the electronic components and the inside of the housing. In addition, the direct entry of a continuous flow of ambient air requires complicated gates or passages to prevent unintended intrusion of foreign objects into the air ducts.

Prior art devices have also completely buried the electronic components underground. However, such buried substantially hinder access to the components for repair or maintenance.

SUMMARY OF THE INVENTION

The present invention includes an enclosure for providing a stable thermal environment for outdoor electronics. The present invention includes two substantially isolated fluid paths. The first path is a substantially closed loop circuit for transferring thermal energy between an underground heat exchanger and the electronics. The underground heat exchanger transfers thermal energy between the surrounding ground and the fluid in the closed loop. The second path includes an Open circuit for creating a flow of ambient air over the electronic components.

The present invention includes a ground sleeve disposed underground and an aboveground housing attached to the ground sleeve. The electronic components are enclosed by the housing, and the ground sleeve provides the underground heat exchanger.

DETAILED DESCRIPTION OF THE PREFERRED EMBODIMENT

Figure 1:
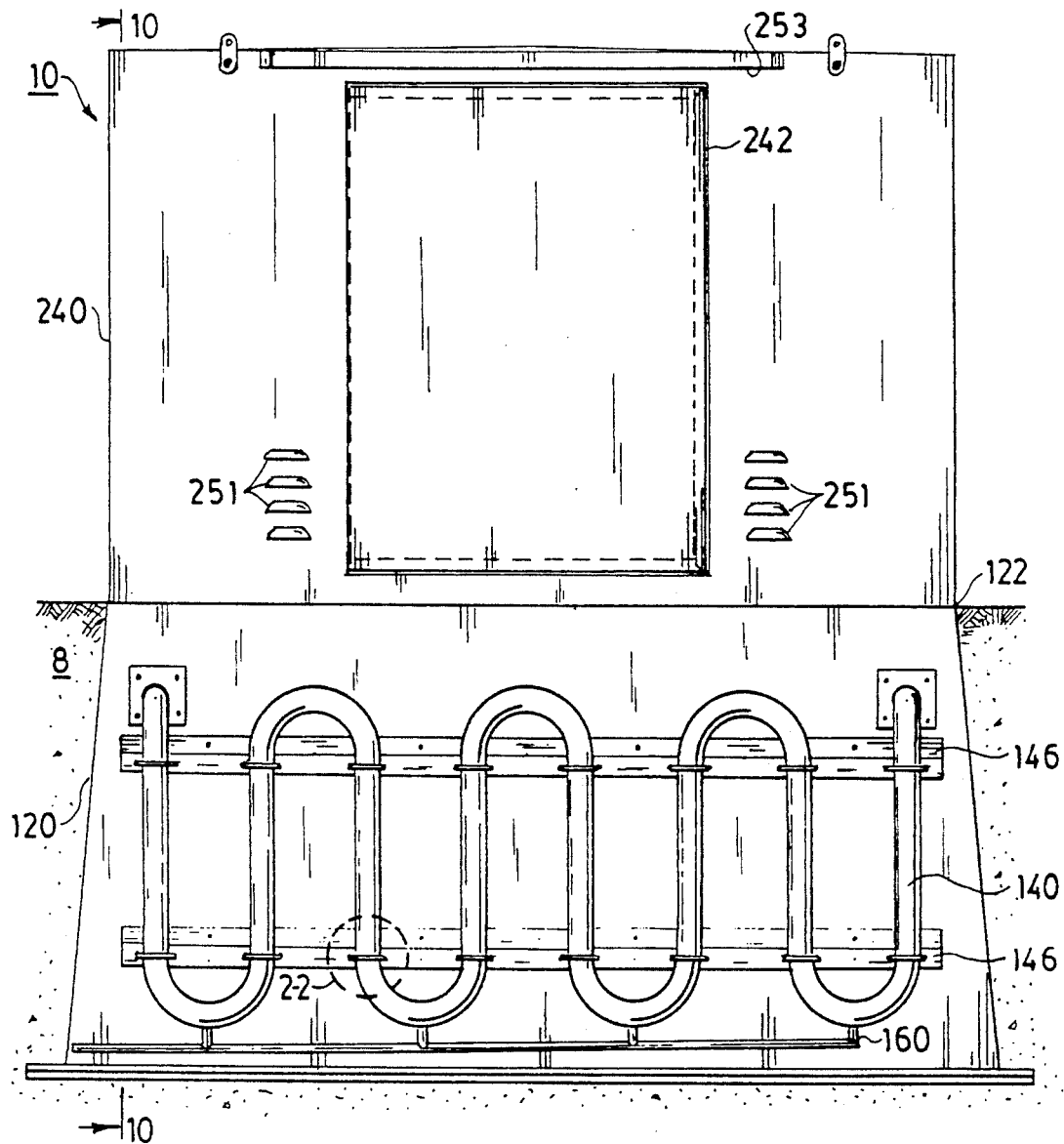
FIG. 1 is a side elevational view of the enclosure.

Referring to FIG. 1, the enclosure 10 of the present invention includes an underground, or subterranean ground sleeve 120 attached to an above ground housing 240.

Figure 8:
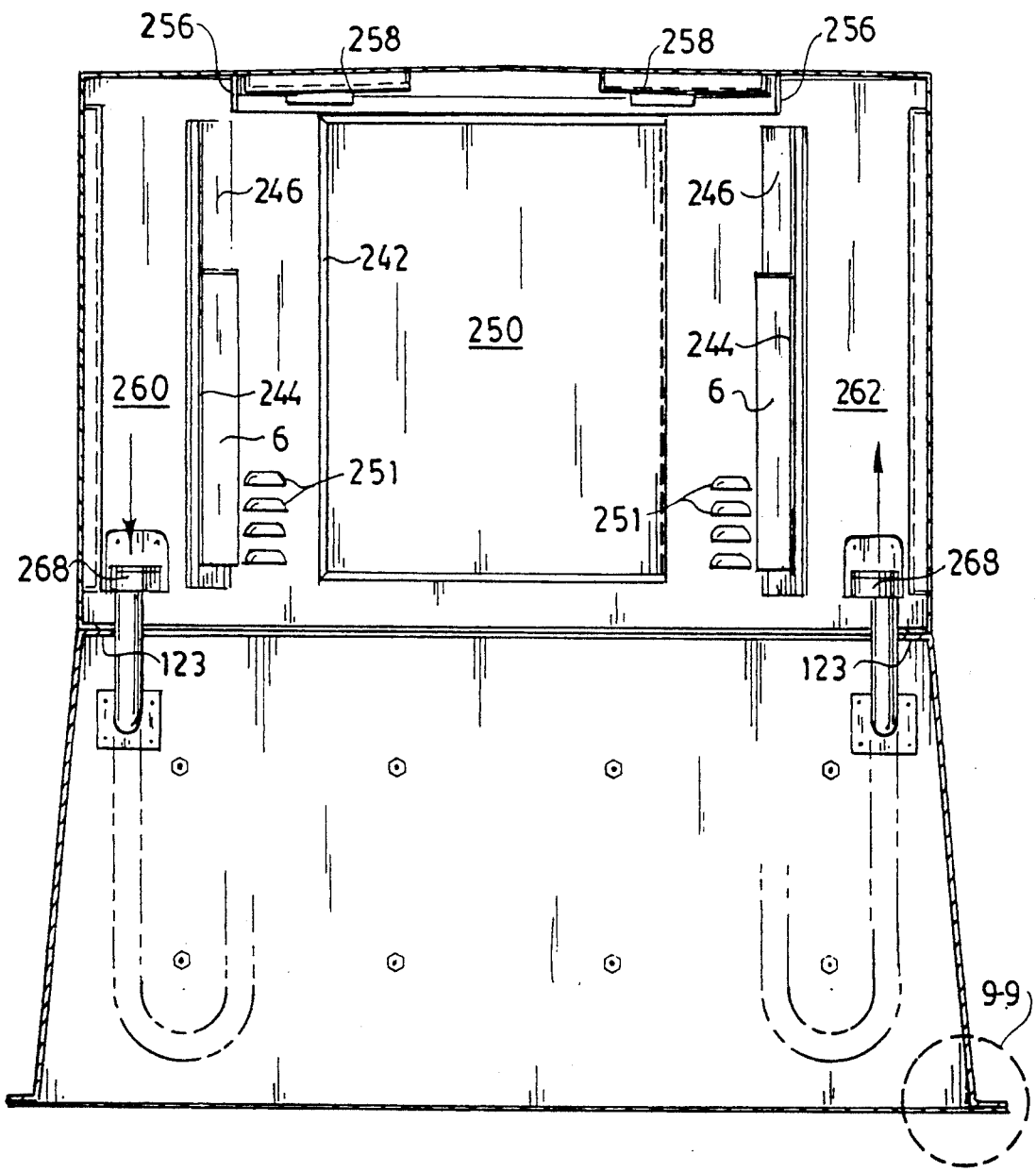
FIG. 8 is a cross sectional view taken along lines 8—8 of FIG. 5 showing a sectional side elevational view of the enclosure.
Figure 9:
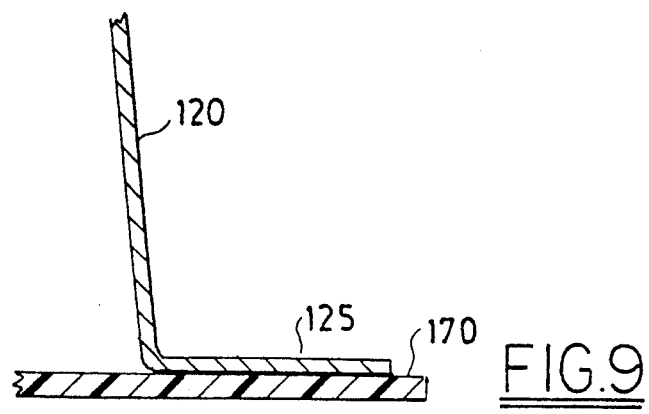
FIG. 9 is an enlarged cross sectional view taken along lines 9—9 of FIG. 8.
Figure 10:
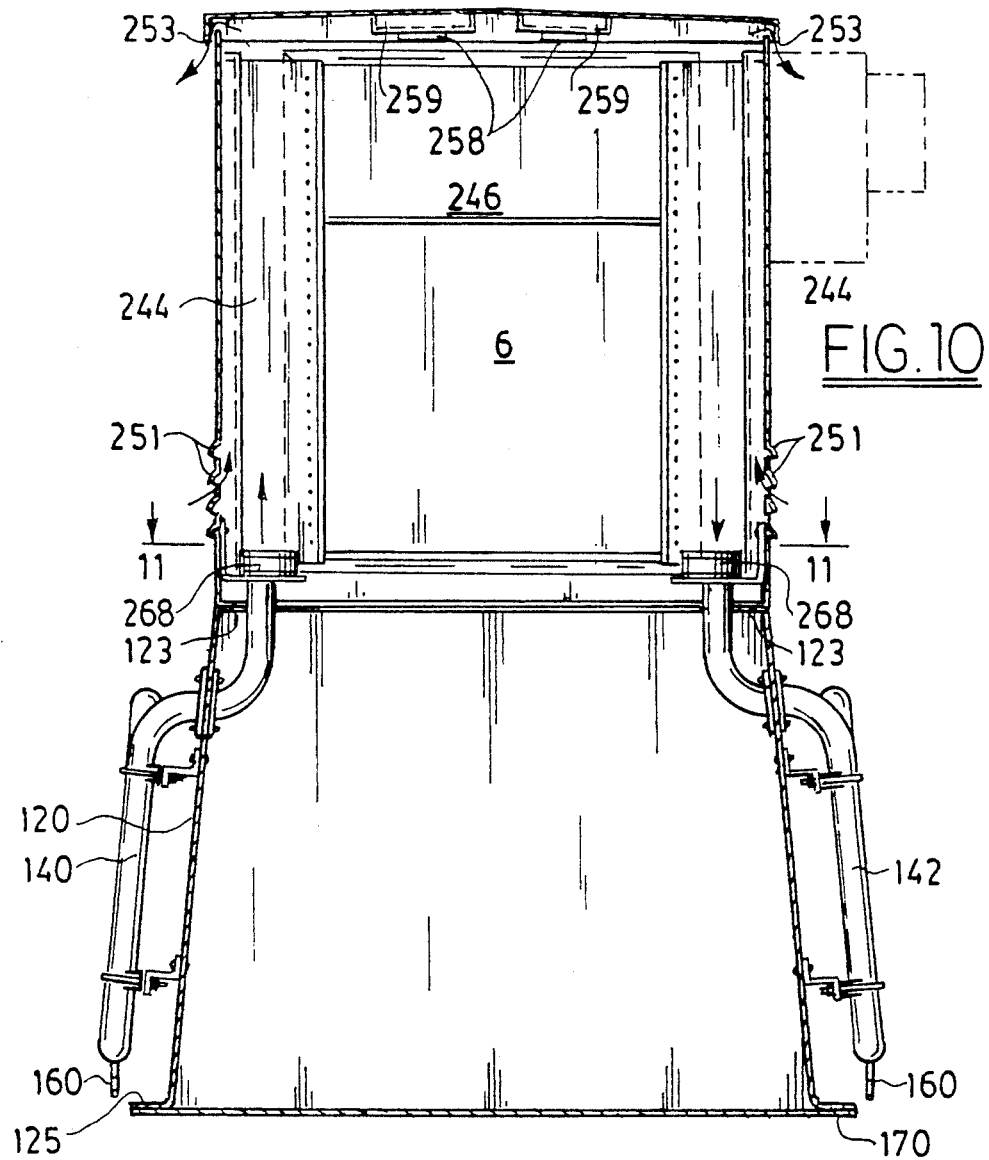
FIG. 10 is an end elevational view taken along lines 10—10 is FIG. 1.

Referring to FIGS. 1, 8 and 10, the ground sleeve 120 defines an upper periphery 122 substantially parallel with the surrounding ground level and a lower periphery 124 buried beneath the ground level. The lower periphery 124 is larger than the upper periphery 122 such that the ground sleeve 120 defines a substantially hexahedron cavity. The upper periphery 122 includes an inwardly projecting mounting lip 123. The lower periphery 124 includes an outwardly projecting supporting lip 125. The cavity is sized to accommodates wires, or cables. The ground sleeve 120 is in direct thermal contact with the surrounding ground 8. The ground sleeve may be formed of 10 gauge corten steel.

In a preferred embodiment, radiators 140,142 project from the interior to the exterior of the ground sleeve 120 such that the radiators are in direct thermal contact with the surrounding ground 8. The ground sleeve 120, and/or radiators 140,142 are thermally coupled to the surrounding ground 8 to function as a heat exchanger with the surrounding ground. The thermal coupling allows for conductive and radiative heat transfer between the surrounding ground and the ground sleeve 120 and/or radiators 140,142. The radiators 140,142 are located such that one radiator 140 extends externally along side of the ground sleeve 120, and the other radiator 142 extends externally along the parallel side of the ground sleeve. Each radiator 140,142 defines a serpentine configuration and is affixed to the exterior of the ground sleeve 120. The serpentine configuration of the radiator 140,142 allows for approximately 18 feet of radiator to be disposed along approximately 5 feet of the ground sleeve.

The length of the radiators is determined by a number of factors including geographic location, configuration, type of electronic components, and desired flow rate through the radiators. Preferably, the radiators have a sufficient length so that under operating conditions, the temperature of the fluid passing through the radiator substantially approaches the temperatures of the surrounding ground as the fluid exits the radiator. The radiators 140,142 may be formed of 2" 14 gauge tubing.

Figure 2:
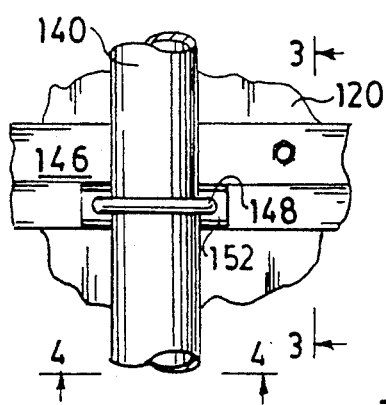
FIG. 2 is an enlarged view taken along lines 2—2 of FIG. 1 showing the radiator tube in a clamp.
Figure 3:
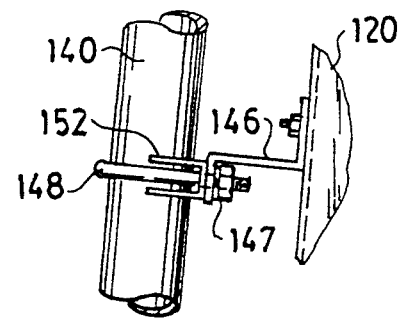
FIG. 3 is a cross sectional view taken along lines 3—3 of FIG. 2 showing a portion of the radiator in the clamp.
Figure 4:
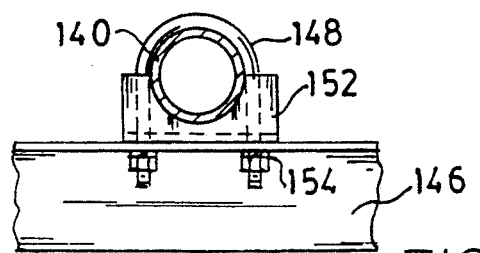
FIG. 4 is a cross sectional view taken along lines 4—4 of FIG. 2 showing the radiator pipe in clamp.

Each radiator 140,142 is secured to the exterior of the ground sleeve 120. Parallel support brackets 146 are bolted along the ground sleeve 120 and include cooperating apertures 147 for receiving U-clamps 148, as shown in FIGS. 2-4. The U-clamps extend about a portion of the circumference of the radiator 140,142 and pass through a saddle 152 for substantially contacting the entire circumference of the radiator. The ends of the U-clamps 148 extend through the support bracket 146 and engage a threaded fastener 154 to secure the radiator 140,142 relative to the ground sleeve 120.

Figure 5:
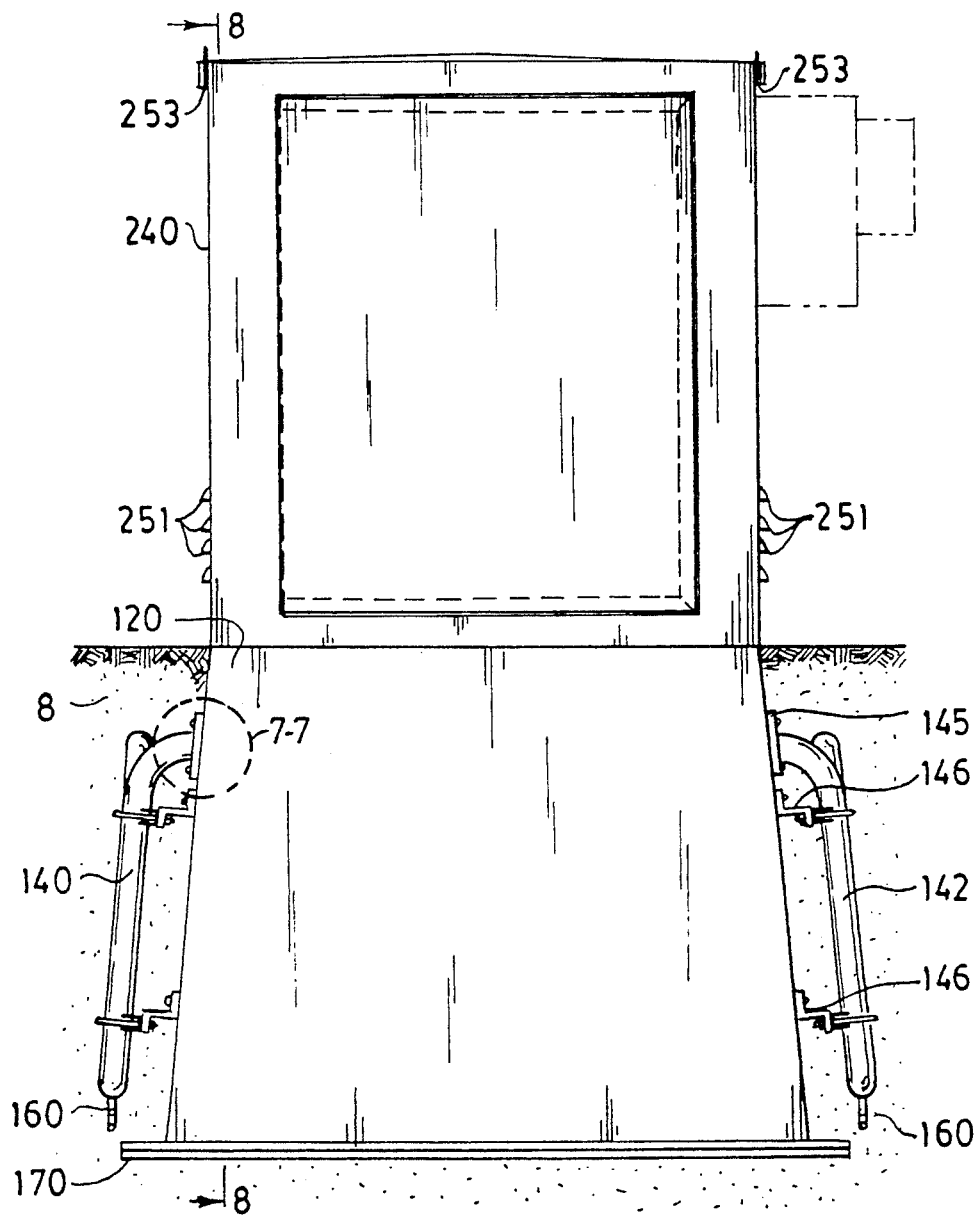
FIG. 5 is an elevational end view of the enclosure.

As shown in FIGS. 1, 5 and 10, a condensate manifold 160 extends beneath the lower portions of each radiator 140,142 at an inclined angle. The lower most portions of each radiator 140,142 are fluidly connected to a condensate manifold 160. The condensate manifold 160 discharges liquid from the radiators 140,142 to the surrounding ground 8.

Each radiator 140,142 passes from the exterior of the ground sleeve 120 to the interior of the ground sleeve below ground level. The radiator 140,142 may pass continuously through the wall of the ground sleeve 120, or may be formed of separate internal and external portions.

Figure 7:
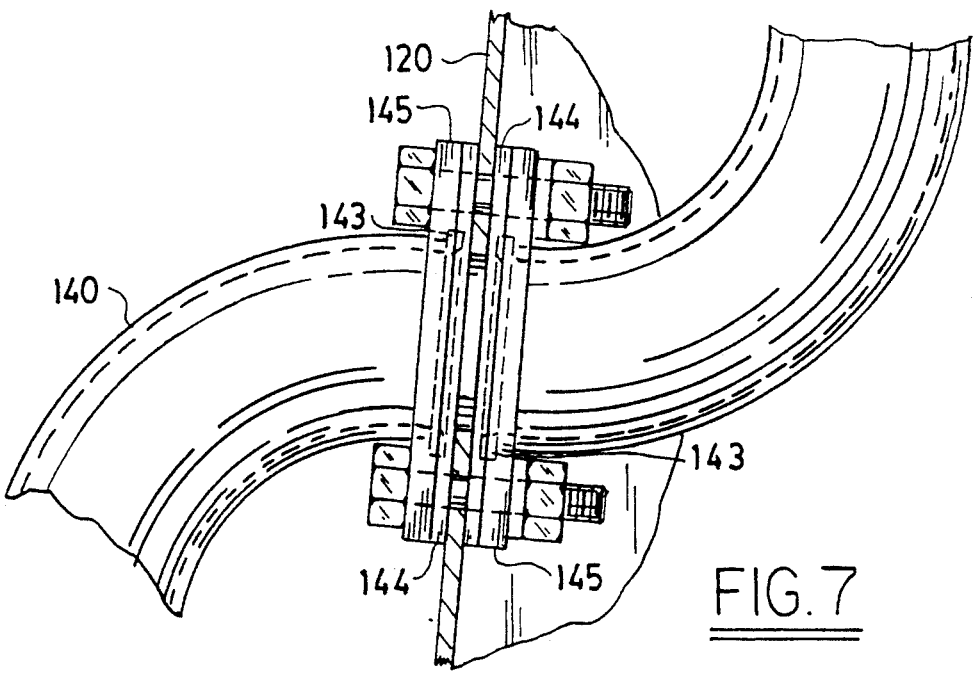
FIG. 7 is an enlarged view taken along lines 7—7 of FIG. 5 showing a partial cut away view of the enclosure and the radiator.

Referring to FIG. 7, the structure of separate internal and external portions is shown. The terminal end of each portion includes a peripheral sealing flange 143. The sealing flange 143 sandwiches a gasket 144, such as neoprene, between the flange 143 and the wall of the ground sleeve 120. Flange plates 145 are located on the exterior and the interior of the ground sleeve to sandwich the sealing flange 143 and the gasket 144 between the wall of the ground sleeve and the flange plate 145. The flange plates 145 are clamped together by threaded fasteners.

As shown in FIGS. 8 and 10, the ground sleeve 120 defines substantially open upper end. The above ground housing 240 cooperates with the mounting lip 123 and is attached to the upper end of the ground sleeve 120 to extend upward above the ground. Referring to FIGS. 1, 5 and 8 the housing 240 includes access doors 242 for accessing electronic components 6 within the housing.

As shown in FIGS. 8 and 10, racks 244 are disposed in the housing 240 for retaining the electronic components 6. Each pair of racks 244 oppose each other and extend inward from the longitudinal walls of the housing 240. Upon operable engagement of the electronic components 6 upon the racks 244, the components and racks substantially separate the housing into a central vented chamber 250 and circulating chambers 260,262. If insufficient electronic components are retained on the racks 244 to separate the housing 240 into substantially separate chambers, a blank or dummy wall 246 may be attached to the racks to form the necessary separation of chambers.

A plurality of inlets 251 are disposed proximal to the bottom of the vented chamber 250. Exhaust vents 253 for the vented chamber 250 are located proximal to the top of the housing 240. The top or ceiling of the housing 240 includes baffles 256 which project downwardly to extend into the housing. The baffles 256 are separated from the racks 244, such that upon installation of the electronic components 6, the components and baffles substantially isolate the vented chamber 250 from the circulating chambers 260,262.

Figure 6:
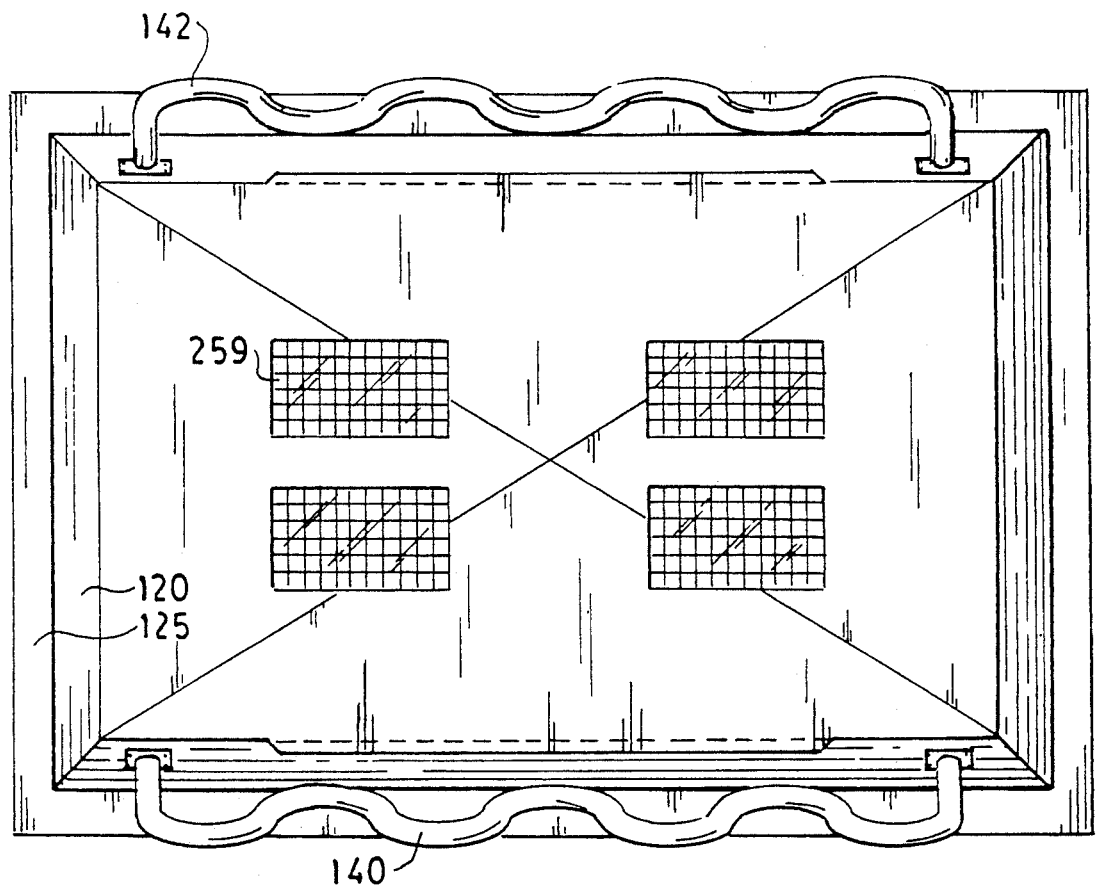
FIG. 6 is a top plan view of the enclosure.
Figure 11:
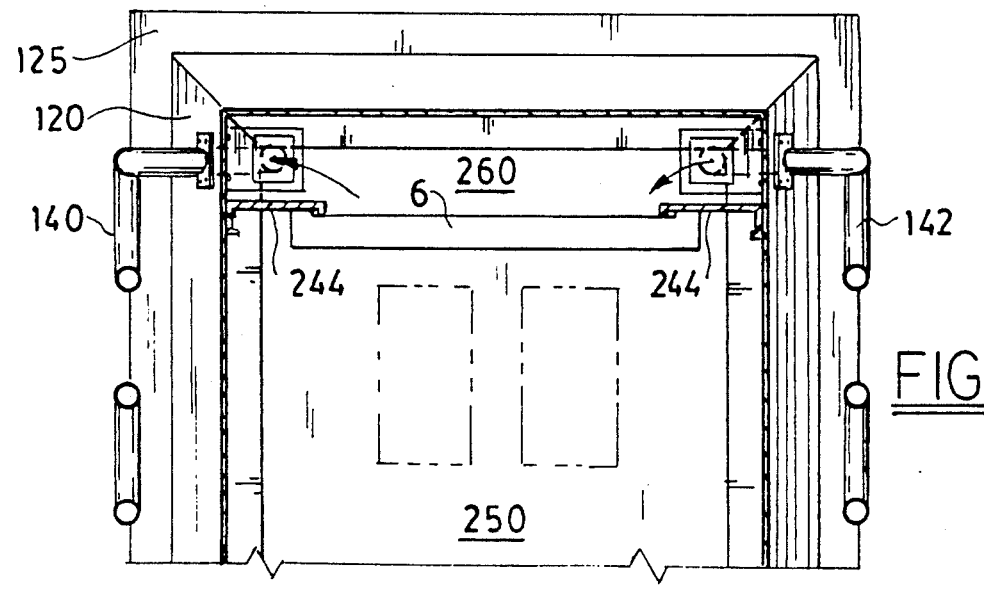
FIG. 11 is a partial top cross sectional view of the enclosure taken along lines 11—11 of FIG. 10.

As shown in FIGS. 8 and 11, the housing 240 includes ambient fans 258 in the vented chamber 250. Referring to FIGS. 6, 8 and 10, the roof of the housing 240 includes a plurality of solar panels 259. The solar panels 259 provide the motive force for operating the ambient fans 258 in the vented chamber. Alternatively, the ambient fans 258 may be driven by an on-line power source.

As shown in FIGS. 8, 10 and 11, the housing 240 also includes four tube axial fans 268. The tube axial fans 268 are disposed such that the lower portion of each of the circulating end chambers 260,262 includes two of the fans. The fans 268 are coaxially aligned with a terminal end of the radiators 140,142 such that for each radiator, one fan 268 forces air into the radiator and the other fan withdraws air. In addition, the fans are disposed within each circulating chamber 260,262 such that one fan introduces air from one radiator and one fan discharges air into the other radiator.

The housing 240, ground sleeve 120 and radiators 140,142 define two substantially isolated fluid paths or circuits. The first path is a geothermal circuit for exchanging thermal energy between the surrounding ground and the electronic components 6. The second circuit is a single pass open path for creating a flow of ambient air over the components 6.

The radiators 140,142 and end chambers 260,262 define a substantially closed loop extending from the first radiator 140 through a first end chamber 260, through the other radiator 142, through the second circulating chamber 262 and into the first radiator 140.

The vented chamber 250 in the housing 240 draws in ambient air through the inlet vents 251 and discharges the air through the exhaust vents 253. Thereby defining an open, or single pass fluid path.

INSTALLATION

The present invention accommodates the above ground connection and transfer of energy from buried cables, and provides a stable thermal environment for the electronic components 6. Upon excavation of the surrounding ground for the cable connection, stone dust is placed in the bottom of the hole. Referring to FIGS. 1, 5, and 8-10 a resilient flexible flooring 170 is disposed on the stone dust. Preferably, the flooring 170 is a 60 durometer neoprene moisture barrier. Cuts or slits are formed in the flooring 170 through which the cables or wires pass. The ground sleeve 120 is lowered into the hole such that the cables or wires pass through the flooring 170 and into the cavity of the ground sleeve 120. The supporting lip 125 of the ground sleeve 120 contacts the flooring 170 to form a sealing relation therebetween.

The remaining excavation is back filled with stone dust and top soil such that the top of the ground sleeve 120 is approximately two inches above the plane of the surrounding ground 8. As the walls of the ground sleeve 120 taper inward as they extend upward, the weight of the surrounding ground 8 forces the ground sleeve down against the flooring 170, thereby ensuring a sealing relationship between the ground sleeve and the flooring, and anchoring the ground sleeve without requiring construction of permanent foundations.

The housing 240 is attached to the ground sleeve on the mounting lip 123. The necessary electronic components 6 are secured to the racks 244 and interconnected to the incoming and outgoing wires. As the electronic components 6 are secured on the racks 244, one portion of the components faces the central, vented ambient chamber 250 and the otherside faces the circulating chambers 260,262. If necessary, the blank walls 246 are affixed to the racks 244 to separate the vented chamber 250 from the circulating chambers 260,262.

OPERATION

The interconnection and dispersion of the electricity produces substantial quantities of heat. This heat in combination with fluctuating ambient temperatures and solar energy can create a sufficient increase in temperature to induce temporary failure of the components 6 due to overheating.

The enclosure 10 employs either, or both of the fluid circuits for regulating the temperature in the housing. As the closed loop, geothermal circuit includes an underground heat exchanger with the surrounding ground 8, a relatively constant heat sink or source is thermally coupled to the components 6. In general, a fluid such as air is passed through the geothermal circuit. Upon operation of the axial fans 268 the air flows through the radiator 140 and is discharged into an end circulating chamber 260. The air thermally contacts the exposed portion of the components 6. The air is then drawn into the other radiator 142. The air passes through the radiator 142 to exchange thermal energy with the surrounding ground 8. The tempered air is then introduced into the other circulating chamber 262.

During the summer months, when excess heat may build up in the housing, the first fluid circuit transfers thermal energy from the electronic components 6 to the surrounding ground 8 through the radiators 140,142.

During the summer, the circulated air in closed circuit is relatively cool and thereby cools the electronic components 6. Although the circulating chamber 260,262 may be completely isolated from the vented chamber 250, the circulating chambers need not completely separate from the ambient chamber 250. Preferably, at least approximately 80% of the entire volume of the cooling fluid in the circulating chambers 260,262 is reintroduced into the radiators. That is, less than 20 percent of the air in the geothermal circuit is replaced for each circulation. During the initial start up, or circulation of the replacement volume of fluid, condensation may form in the radiators 140,142. The condensation passes to the bottom of the radiator 140,142, into the condensate manifold 160 and is discharged from the system. As geothermal circuit is substantially closed, any moisture within the circulating air is removed. The circulation of substantially dry air through the radiators 140,142 allows for optimal efficiency of the radiators, thereby, allowing the radiators to dissapate more thermal energy. The dehumidifying action of the air within the closed circuit reduces degradation of the electronic components 6.

During summer months, when excess heat accumulates in the housing, the open path cooperates with the geothermal circuit. Ambient air enters through the inlets 251 of the housing 240 to pass into the vented ambient chamber 250. The ambient air contacts the electronic components 6 to withdraw further thermal energy. The heated air rises to be discharged through the exhaust vents 253 in the top of the housing 240.

Fluid flow through the ambient chamber 250 may either be accomplished by natural convention or forced. The power for forcing air through the ambient chamber 250 may be supplied by the solar panels 259 disposed in the roof of the housing. During the application of solar energy to the housing 240, the solar panels 259 produce sufficient electricity to drive the ambient fans 258 for drawing ambient air through the inlets 251 and discharging the heated ambient air through the exhaust vents 253.

Preferably, the ambient fans 258 are powered by the solar panels 259. As the absorption of solar energy by the housing 240 can significantly raise the inside temperature, it is desirable to pass air through the vented chamber 250. As the solar panels 259 produce power in proportion to available solar energy, the passing of air through the vented chamber 250 by the fans 258 is directly related to the amount of solar energy absorbed by the housing 120.

The discharging of thermal energy through the vented chamber 250 reduces the load on the closed circuit, thereby preventing thermal saturation of the surrounding ground 8. The vented chamber 252 discharges sufficient thermal energy to the ambient atmosphere to preclude thermal saturation of the surrounding ground by the closed circuit.

Alternatively, during the winter months the closed, or geothermal circuit may transfer thermal energy from the surrounding ground 8 to the electronic components 6. The geothermal circuit thereby supplements the heat generated during normal operations to raise the temperature of the components 6 above the ambient atmospheric temperature. The radiators 140,142 thereby provide an underground heat exchanger in a substantially closed looped geothermal heat exchanging circuit.

One side of the electronic components 6 in the racks 244 are thereby exposed to a substantially closed fluid circuit using the underground geothermal heat exchanger. The other side of the components 6 is exposed to a single pass of ambient air through the ambient chamber 250.

While a preferred embodiment of the invention has been shown and described with particularity, it will be appreciated that various changes and modifications may suggest themselves to one having ordinary skill in the art upon being apprised of

What is claimed:

1. An enclosure for providing a relatively stable thermal environment for outdoor electronic components, comprising:
   (a) a ground sleeve extending below the surrounding ground level, the ground sleeve defining a subterranean cavity;
   (b) an above ground housing connected to the ground sleeve, the above ground housing enclosing the electronic components and defining a central chamber and substantially separate circulating chamber, wherein the central chamber is substantially open to the subterranean cavity;
   (c) an underground heat exchanger thermally coupled to the surrounding ground, the underground heat exchanger fluidly connected to the circulating chamber to define a substantially closed fluid circuit; and (d) first circulating means circulating a first fluid in the substantially closed fluid circuit for transferring thermal energy between the underground heat exchanger and at least a portion of the electronic components.

2. The enclosure of claim 1 further comprising:
(a) outlet means fluidly connected to the underground heat exchanger for removing condensate from the underground heat exchanger.

3. The enclosure of claim 1, further comprising second circulating means in fluid communication with the substerranean cavity for creating a flow of ambient air through the central chamber.

4. The enclosure of claim 1 wherein the underground heat exchanger includes a radiator thermally coupled to the surrounding ground.

5. The enclosure of claim 4, further comprising a fan fluidly connected to a circulating chamber for circulating the first fluid between the underground heat exchanger and the circulating chamber.

6. The enclosure of claim 1, wherein the substantially closed fluid circuit is sufficiently closed to retain at least 80 percent of the first fluid for each circulation of the first fluid through the substantially closed fluid circuit.

7. An enclosure for providing a stable thermal environment for outdoor electronic components, comprising:
(a) a ground sleeve extending below ground level to define an underground cavity, such that the ground sleeve is thermally coupled to the surrounding ground;
(b) an above ground housing affixed to the ground sleeve and enclosing the electronic components;
(c) a first substantially closed fluid circuit circulating a first fluid in direct thermal contact with at least a portion of the ground sleeve and at least a portion of the electronic components; and
(d) a second substantially open fluid circuit passing through a portion of the above ground housing for permitting a flow of ambient air through a portion of the above ground housing.

8. The enclosure of claim 6 wherein the ground sleeve includes a radiator thermally coupled to the surrounding ground and the first fluid.

9. The enclosure of claim 8 wherein the radiator is external of the ground sleeve.

10. The enclosure of claim 7 wherein the first substantially closed fluid circuit is sufficiently closed to recirculate at least approximately 85 percent of the first fluid for each circulation through the first circuit.

* * * * *